US007237039B2

(12) United States Patent
Leon et al.

(10) Patent No.: US 7,237,039 B2
(45) Date of Patent: Jun. 26, 2007

(54) METHOD AND APPARATUS FOR COMPRESSING A STREAM

(75) Inventors: David Leon, Irving, TX (US); Khiem Le, Coppell, TX (US)

(73) Assignee: Nokia Corporation, Espoo (FI)

( * ) Notice: Subject to any disclaimer, the term of this patent is extended or adjusted under 35 U.S.C. 154(b) by 689 days.

(21) Appl. No.: 09/966,462

(22) Filed: Sep. 28, 2001

(65) Prior Publication Data

US 2002/0083205 A1 Jun. 27, 2002

(51) Int. Cl.
*G06F 13/00* (2006.01)
(52) U.S. Cl. .................. 709/247; 709/231; 709/236; 709/237
(58) Field of Classification Search ................ 709/231, 709/236, 237, 245, 246, 247, 248
See application file for complete search history.

(56) References Cited

U.S. PATENT DOCUMENTS

| 5,535,199 A * | 7/1996 | Amri et al. ................. 370/392 |
| 5,838,791 A * | 11/1998 | Torii et al. .................. 380/217 |
| 6,292,840 B1 * | 9/2001 | Blomfield-Brown et al. .... 709/247 |
| 6,314,095 B1 * | 11/2001 | Loa .............................. 370/352 |
| 6,388,584 B1 * | 5/2002 | Dorward et al. .............. 341/51 |
| 6,680,955 B1 * | 1/2004 | Le .............................. 370/477 |
| 6,751,209 B1 * | 6/2004 | Hamiti et al. ................ 370/349 |
| 6,839,339 B1 * | 1/2005 | Chuah .......................... 370/349 |

OTHER PUBLICATIONS

"Draft RFC Robust Header Compression", Carsten Burmeister et al, Network Working Group, p. 1-110, Sep. 18, 2000.*
Borman et al., Robust Header Compression (ROHC), Internet Draft, Sep. 19, 2000, pp. 1-111.
Martensson et al., "ROCCO Conversational Video Proviles", Internet Draft, Mar. 10, 2000, pp. 1-30.
Jonsson et al., Robust Checksum-based header Compression (ROCCO), Internet Draft, Mar. 10, 2000, pp. 1-67.
Bormann et al., "Robust Header Compression", Sep. 18, 2000, pp. 1-111, XP002249800.
Martensson et al., "ROCCO Conversational Video Profiles", Mar. 10, 2000, pp. 1-30, XP002314039.
Jonsson et al., "Robust Checksum-based Header Compression (ROCCO)", Mar. 10, 2000, pp. 1-67, XP002901828.

* cited by examiner

*Primary Examiner*—Viet D. Vu
(74) *Attorney, Agent, or Firm*—Squire, Sanders, Dempsey L.L.P.

(57) ABSTRACT

An apparatus and method, in a data network to compress headers of packets that carry media information having an RTP TS which cannot be linearly extrapolated from the RTP SN.

49 Claims, 2 Drawing Sheets

METHOD AND APPARATUS FOR COMPRESSING A STREAM

FIELD OF THE INVENTION

The invention relates to robust header compression. State-of-the-art robust header compression scheme compress the RTP/UDP/IP headers to typically one byte for audio streams and two bytes for video streams. This new scheme compresses the RTP/UDP/IP headers of some video streams to one byte.

BACKGROUND OF THE INVENTION

The current problem of header compression is that, for some media such as video, both compressed sequence number (SN) and compressed timestamp (TS) have to be sent in most, if not all compressed packets. The invention allows one to send only the SN, and derive TS from SN.

SUMMARY OF THE INVENTION

The new scheme takes advantage of the pattern observed in the media stream to allow the compressor to get into the highest compression state (SO or second order state) more often.

Other advantages will be readily appreciated, as the invention becomes better understood by reference to the following detailed description and the accompanying drawings.

DETAILED DESCRIPTION OF THE INVENTION

Header compression framework:

This application claims the benefit of U.S. Provisional Application No. 60/236,120, filed Sep. 28, 2000 and U.S. Provisional Application No. 60/239,703 filed Oct. 12, 2000.

For an overview of the robust compression framework, refer to Robust header compression (ROHC), draft-ietf-rohc-rtp-02, draft internet Request For Comments (RFC), which is attached as an appendix hereto and incorporated by reference. This will be referred to hereafter as the current scheme or ROHC. The compression can be in three different states: initialization, first order, second order. In the initialization state, the compressor sends full header packets (no compression). In first order state, it sends FO packets which contain only encoded dynamically changing fields. A typical FO header size is two bytes or more. In SO state, it sends only an encoded SN. The SO state is defined relative to a pattern that a series of header fields follow. There are different modes in which the compression scheme can operate. In reliable mode, the compressor makes sure, through decompressor acknowledgements, that the decompressor is synchronized before going to a higher compression state. In unidirectional or optimistic mode, if the compressor estimates that under all likelihood the decompressor is synchronized, it then goes to a higher compression state. Optimistic and unidirectional mode require that the decompressor be able, for example through the use of a checksum, to check that the compressor and decompressor are actually synchronized.

SO Pattern

The current pattern is defined as:

second order difference (relative to the SN) of TS being null second order difference of IP-ID being null All remaining fields being constant.

Figure 1:
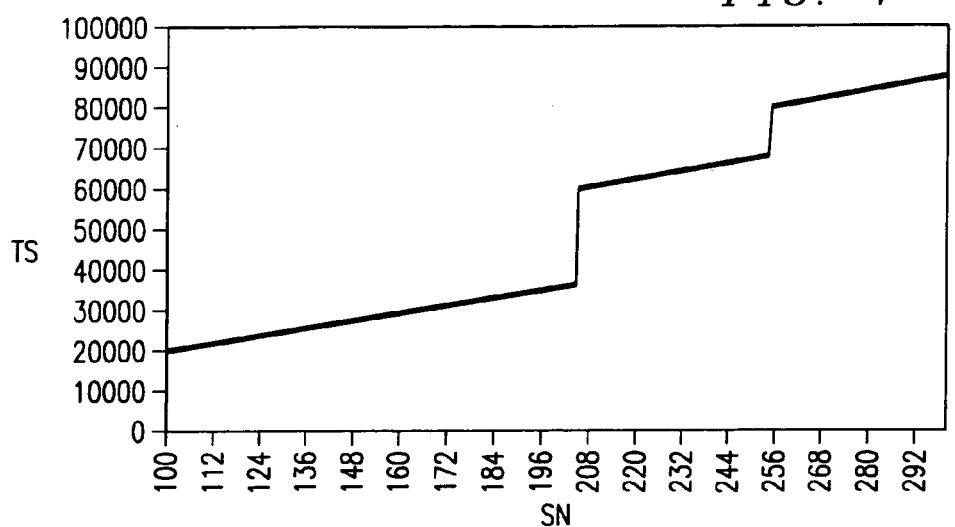
FIG. 1 shows typical cases of TS as a function of SN for audio.

This proves to be very well suited to audio. For a typical audio stream, the pattern should be verified for the packets generated during a talkspurt (i.e. when actual speech is detected and encoded by the encoder). Since no or very few (comfort noise) packets are usually generated during silence, this results in the first few packets of a talkspurt to be sent as FO packets and the rest of the packets sent as SO. However, this pattern is not suited to video. This can be seen on FIGS. 1 and 2, which show typical cases of TS as a function of SN for respectively audio and video. In FIG. 1, it is clear that the second order difference is zero over long period of times. However in FIG. 2, timestamp jumps are much more frequent (at every frame boundary) and the second order difference is null only over short period of times (the packets belonging to a given frame which all have the same timestamps).

As a consequence, it might happen that in case of video, the compression state is stuck in FO. In the reliable mode, if the link ROUND-TRIP TIME (RTT) (round trip time) is more than the frame skip (ie the time between two coded frames), the compressor can not reliably get in SO (second order) state. Even in the case of a very fast RTT or in optimistic mode, the compression state would go back to FO at every frame boundary.

Figure 2:
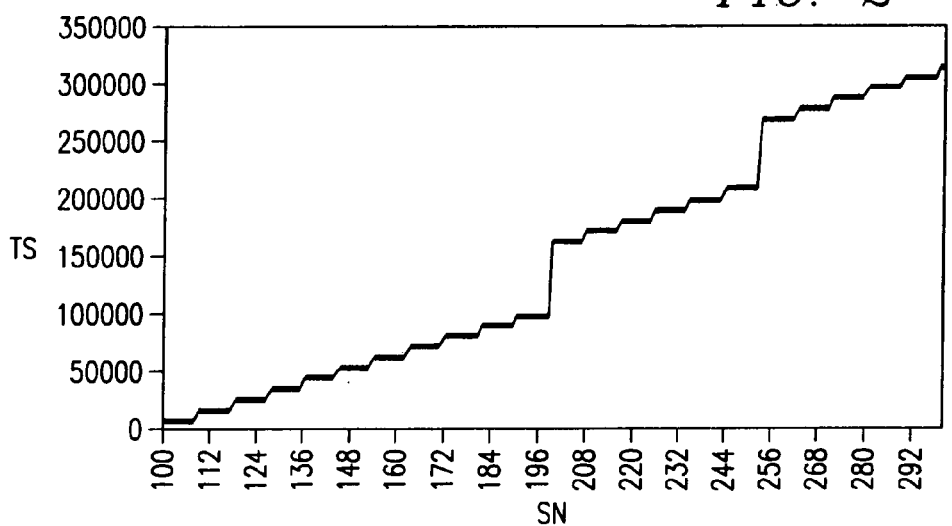
FIG. 2 shows typical cases of TS as a function of SN for video.

As can be seen from FIG. 2, TS is a staircase function of SN. This staircase function could be a pattern used for SO. However to qualify as a pattern, this function has to be fully known. In other words, the length of a step and the jump between steps should be constant over a large enough period of time, i.e. several times the RTT. We argue here that this can be the case, at least when B frames are not used. B frames are considered later in this document. In effect, payload formats for video encoding are such that a given RTP packet may not contain video data from two different frames. Two consecutive (as generated by the sender application) RTP packets will either have the same RTP timestamp if they carry data from the same picture or their timestamp difference will reflect the time interval between their respective frame sampling instants. Therefore, in order to be predictable, the number of packets per frame and the frame skip should be constant. We show hereafter, that in many cases a video encoder can keep these parameters constant.

For the sake of robustness, video applications can choose to packetize a video frame so that it contains a constant number of macro-bloks or in other words every video frame is sliced identically. This is much as an audio packet covers a given length of audio. The only good reason (at least we can think of) why the sending application would choose to do otherwise is if it wanted to limit the maximum packet size. This would imply that some frames may have more packets than the usual number of packets per frame. However, the number of such frames will often be limited. For example, an intra frame could be sent in a higher number of packets. This would imply that the compression goes to FO when these packets are compressed.

An encoder is given a target frame rate. As long as the encoder matches its target frame rate, the timestamp jump will be constant. However, encoder implementations usually only match an average target frame rate and the frame skip may be variable. Nevertheless, at least in the streaming case, an encoder may use a higher buffer (higher delay) which provides greater flexibility to the rate control and maintain the target frame-rate throughout the connection (or at least over a long period of time). The invention is expected to be useful for the encoders that have been so designed.

In addition, the RTP marker bit should be set only for the last packet of a frame. This can thus also be derived from the pattern.

We therefore define a pattern as:
  TS is some function f of SN, where f is more general than just linear extrapolation. For example, f can be a staircase function of SN which has constant length steps and constant jumps between steps.
  The marker bit is also some function g of the SN. For example, the marker bit is set only for the last packet of each step
  IP-ID second order difference is null (same as audio)

Figure 3A:
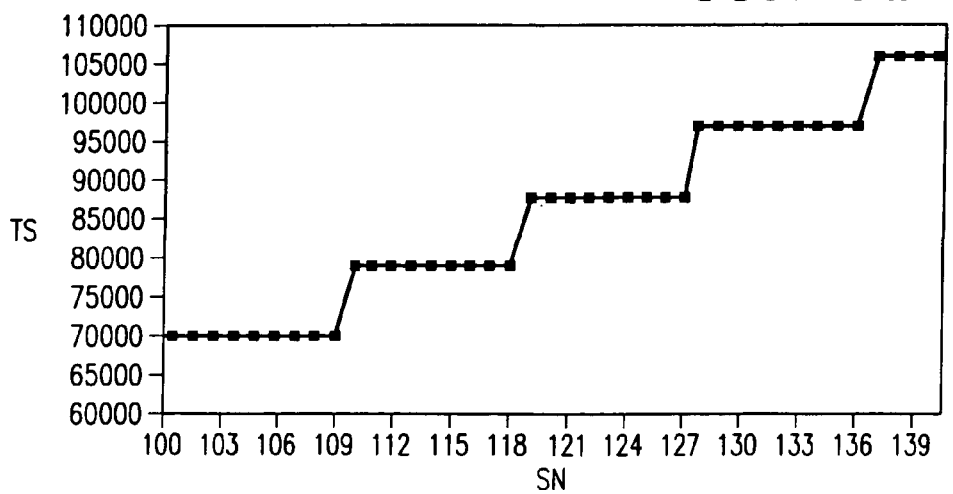
FIG. 3A shows SO pattern, TS as a function of SN.
Figure 3B:
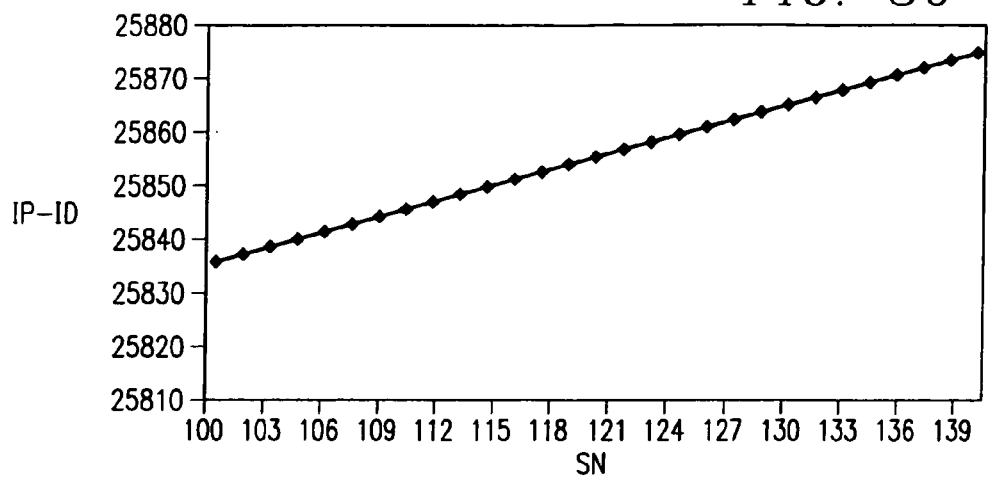
FIG. 3B shows IP-ID as a function of SN.
Figure 3C:
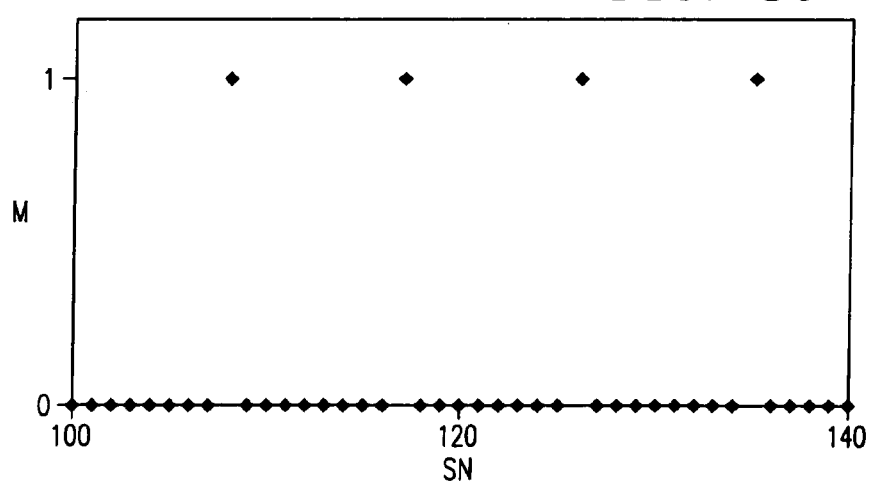
FIG. 3C shows M bit as a function of SN.

Using the example of video, this pattern is shown on FIGS. 3a, 3b, 3c for a series of 40 packets where the frame rate is 10 (frames per second) fps and the number of packets per frame is 9.

Compressor and Decompressor Logic

Figure 4:
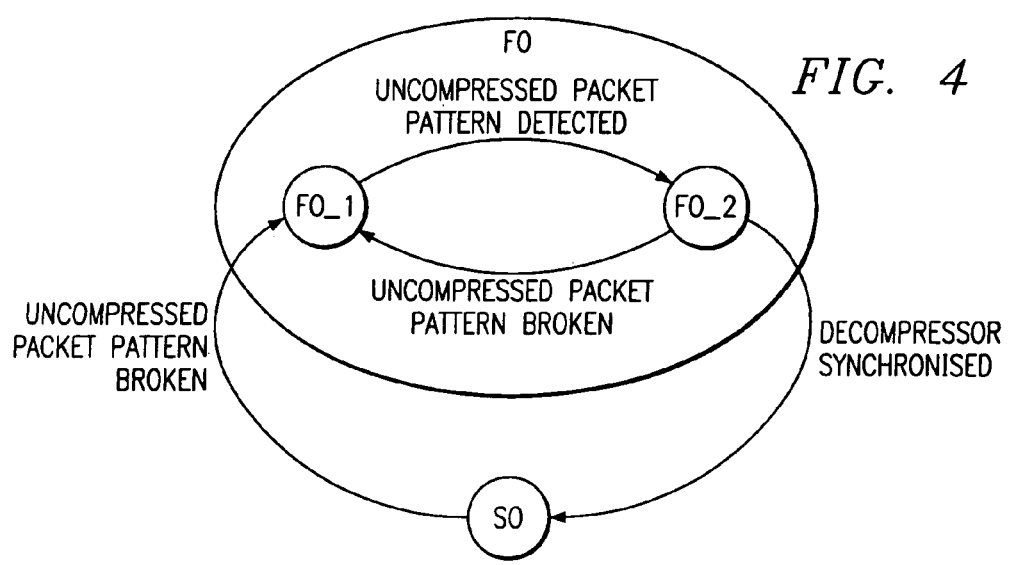
FIG. 4 is a logic diagram showing the compressor logical states.

The only modification to the current scheme introduced by the new pattern is relative to how the compressor and decompressor transitions between the FO and SO state. The compressor is the one making the decision as to which state to operate. The decompressor follows the compressor decisions. It operates in FO state when receiving FO packets and it operates in SO state when receiving SO packets. The compressor logic is shown on FIG. 4. The FO state is here conceptually divided up into two sub-states FO_1 and FO_2. The compressor enters FO in FO_1 and moves to FO_2 if a pattern is detected. The compressor goes from FO_2 to SO when the decompressor is synchronized, that is when the decompressor would be able to decompress SO packets.

The issues peculiar to the new scheme are therefore:
  How the decompressor decompresses packets in SO state
  How the compressor acquires the pattern
  How the compressor knows the decompressor is synchronized in order to get into SO state
We examine hereafter each of these issues.

SO Packets Decompression

In SO state, the decompressor must know the pattern functions f and g, in order to decompress SO packets. Again using the video example, the decompressor must know n, the number of packets per frame and TS_inc the timestamp increment between two frames. In addition, it must have previously successfully decompressed a packet which was a first packet frame.

Let call $SN\_0$, $TS\_0$ the sequence number and timestamp of such a packet. For any incoming SO packet, the decompressor decompresses SN as in the current scheme. If n and m are the quotient and modulo of $SN-SN\_0$ by q, i.e. $SN-SN\_0=q*n+m$, the decompressor computes the packet TS according $TS=TS\_0+q*TS\_inc$. The marker bit M is set only if $m=n-1$. All other fields are obtained as in the current scheme.

Pattern Detection

The compressor can determine the function by observation of the stream/learning or API or some other means. Again using the video example, and assuming stream observation, the new pattern requires getting enough packets from the sender before the decision can be made. This in turn requires to buffer a copy of a certain number of past packets.

The pattern could be detected by searching in this buffer for three packets whose (SN,TS,M,IP-ID) are such that the second order IP-ID differences are null and (SN_1, TS_1, M_1) (SN_2, TS_2,M_2) (SN_3, TS_3,M_3) are such that:
  SN_2=SN_1+1
  TS_3=TS_2
  M_1=1
  M_2=0
  M_3=1

This implies that SN_2 is a first packet frame and TS_inc=TS_2-TS_1 and The number of packets per frame is n=SN_3-SN_2

There is a particular case where the pattern can be detected by two packets
  (SN_1, TS_1,M_1) (SN_2, TS_2,M_2) such that:
  SN_2=SN_1+1
  M_1=1
  M_2=1

In that case, there is only one packet per frame.

Decompressor Synchronization

In the current scheme, the compressor needs only to get two ACKs from the decompressor to make sure that the latter is synchronized. The decompressor derives from the last two received packets the first order differences required to decompress SO packets.

However, with the new pattern, this is not enough. There are several ways the compressor may make sure the decompressor is synchronized. We suggest here three of them.

After detecting the pattern, the compressor can explicitly send the pattern functions f and g to the decompressor using in-band signaling. Again using the video example, the compressor sends n and TS_inc, along with an indication that the marker bit is set only for the last packet of each step. The compressor has just then to make sure that the decompressor has received a packet with a marker bit set (first frame packet). It then knows that the decompressor has all the information needed to decompress the packet. After receiving an FO header carrying the pattern description, the receiver should try to acknowledge packets with the marker bit set so that the compressor can start to send SO packets as soon as possible. Pros: decompressor logic is kept low (no need to perform pattern detection). The compressor does not have to know beforehand if the decompressor is not capable of interpreting the in-band signaling; it can be signaled by a REJECT from the decompressor, with cause "Not recognized". Cons: additional overhead, changes to the current packet format.

Alternatively, the compressor can observe the acks received from the decompressor to determine if the decompressor has acquired the pattern functions f and g. The decompressor is also performing pattern detection on the decompressed packets in FO mode. When the pattern is acquired, this will be signaled in the subsequent ACKs sent to the compressor. When the compressor gets enough ACKs to indicate that the pattern has been detected, it can start sending SO packets. Pros: the overhead is kept at a minimum. The in-band signaling format does not have to be standardized. Cons: the decompressor has to perform pattern detection which incurs more complexity and higher delays in the cases where the link loses packets used for detection; The pattern functions have to be standardized. The compressor must also know if the decompressor is capable of detecting the function f (the reception of ACKs alone does not ensure that the decompressor has acquired the function); this could be done by some capability exchange or negotiation.

The decompressor performs pattern detection and the compressor also performs pattern detection for the packets which have been acknowledged by the decompressor. In other words, the compressor tries to find if the pattern can be detected using only the packets it is certain the decompressor has received. The decompressor should then choose to acknowledge packets which are known to be enough to detect the pattern, for example the triplet shown above. Pros: no modification needed to the packet format. The same packet formats can be used for the audio pattern and the video pattern. Cons: extra-complexity, delay before entering SO, reduces the freedom of the decoder to choose whether or not to ACK a packet.

B and PB frames:

We presented the pattern as a typical pattern for video. However, in the case where B frames are used, this pattern is not followed. We don't consider B frames as a typical case for the following reasons:

B frames are used only by a limited number of codecs. They are not used in MPEG 4 simple profile.

For low bit-rate video conferencing, B-frames are considered not suitable.

This is because the P frame needs to be received before the B-frame can be decoded. For a typical 10 fps frame rate, this would mean an additional 100 ms to the end-to-end delay.

In the case where B-frames are used, there could still be a typical pattern if the encoder chooses to encode a fixed number of B-frames per number of encoded frame, for instance every other frame is a B-frame.

CONCLUSION

This scheme could be beneficial to many applications. There is no penalty if an application does not follow the pattern. In addition, if such a scheme was standardized, it could be an incentive for applications to choose a packetization strategy that is header compression friendly, i.e. which follows the SO pattern. In particular, designers of future video application for 3 G mobile terminals could take this into account.

What is claimed is:

1. A method, comprising:
   acquiring a pattern at a compressor by determining a function of one attribute in relation to another attribute according to a stream that is arriving at the compressor;
   making sure a decompressor is synchronized with the compressor according to the pattern; and
   sending a compressed packet according to the pattern.

2. The method of claim 1, wherein the stream is a real time transport protocol packet stream and the pattern comprises a time stamp function, a marker bit function, a quotient, and a time stamp increment, said making sure comprising:
   sending the pattern.

3. The method of claim 2, wherein the making sure further comprises receiving an indication having a marker bit set.

4. The method of claim 1, wherein the making sure further comprises
   receiving a first ack, and
   receiving a second ack.

5. The method of claim 1, wherein the making sure further comprises pattern detecting at least two packets.

6. The method of claim 5, wherein the pattern detecting comprises acknowledging the at least two packets.

7. The method of claim 6, wherein the acknowledging the at least two packets comprise acknowledging a first packet and acknowledging a second packet and, prior to the pattern detecting the method further comprises:
   receiving a first acknowledgement having at least the first packet; and
   receiving a second acknowledgement having at least the second packet.

8. The method of claim 1 wherein the stream comprises a first packet having a first sequence number and a first marker bit, said stream comprising a second packet having a second sequence number and a second marker bit, the method further comprises:
   acquiring the first packet and the second packet; and
   detecting that the second sequence number is one more than the first sequence number and that the first marker bit and the second marker bit are set.

9. The method of claim 8, wherein the stream is an real time transport protocol packet stream and the pattern comprises a time stamp function, a marker bit function, a quotient and a time stamp increment, and wherein said making sure comprises sending the pattern.

10. The method of claim 1, wherein the media stream further comprises a first packet having a first sequence number and a first marker bit, said stream comprising a second packet having a second sequence number, a second time stamp and a second marker bit, a third packet said third packet having a third time stamp and a third marker bit, and wherein the method further comprises:
    storing the first packet, the second packet, and the third packet;
    detecting that the second sequence number is one more than the first sequence number;
    detecting that the third time stamp is the same as the second time stamp; and
    detecting that the third marker bit is the same as the first marker bit.

11. The method of claim 10, wherein the stream is a real time transport packet stream and the pattern comprises a time stamp function, a marker bit function, a quotient and a time stamp increment, and wherein said making sure comprises sending the pattern.

12. The method of claim 1, further comprising:
    acquiring the pattern at the decompressor.

13. The method of claim 2, wherein the sending the pattern further comprises explicitly sending the pattern from the compressor to the decompressor.

14. The method of claim 1, wherein the stream is a real time transport protocol packet stream and the pattern comprises a time stamp function expressed as a staircase function of the packet serial number, the staircase function having at least one staircase step, and a marker bit function, and wherein said making sure comprises sending the pattern.

15. The method of claim 1, wherein the stream is a real time transport protocol packet stream and the pattern comprises a time stamp function expressed as a staircase function of the packet serial number, the staircase function having at least one staircase step, and a marker bit function wherein the marker bit is set for a last packet of the staircase step, and wherein said making sure comprises sending the pattern.

16. The method of claim 15, further comprising:
setting the marker bit only for the last packet of the staircase step.

17. The method of claim 16, wherein the making sure further comprises receiving an indication having a marker bit set.

18. The method of claim 16, wherein the making sure further comprises
receiving a first ack, and
receiving a second ack.

19. The method of claim 16, wherein the making sure further comprises pattern detecting at least two packets.

20. The method of claim 19, wherein the pattern detecting comprises acknowledging the at least two packets.

21. The method of claim 19, wherein the at least two packets comprise a first packet and a second packet and, prior to the pattern detecting the method comprises:
receiving a first acknowledgement having at least the first packet; and
receiving a second acknowledgement having at least the second packet.

22. The method of claim 16, wherein the real time transport protocol packet stream comprises a first packet having a first sequence number and a first marker bit, said stream comprising a second packet having a second sequence number and a second marker bit, and wherein the method further comprises:
acquiring the first packet and the second packet; and
detecting that the second sequence number is one more than the first sequence number and that the first marker bit and the second marker bit are set.

23. The method of claim 22, wherein the pattern comprises a time stamp function, a marker bit function, a quotient and a time stamp increment, and wherein said making sure comprises sending the pattern.

24. The method of claim 16, wherein the sending the pattern further comprises explicitly sending the pattern from the compressor to the decompressor.

25. A compressor, comprising:
an acquisition unit configured to acquire a pattern at a compressor by determining a function of one attribute in relation to another attribute according to a stream that is configured to arrive at the compressor;
an ensurer unit configured to make sure a decompressor is synchronized with the compressor according to the pattern; and
a sender unit configured to send a compressed packet according to the pattern.

26. The compressor of claim 25, wherein the stream is a real time transport protocol packet stream and the pattern comprises a time stamp function, a marker bit function, a quotient, and a time stamp increment, and wherein said acquisition unit is configured to send the pattern.

27. The compressor of claim 26, wherein the ensurer unit is configured to receive an indication having a marker bit set.

28. The compressor of claim 25, wherein the ensurer unit is configured to receive a first ack and receive a second ack.

29. The compressor of claim 25, wherein the ensurer unit further comprises a pattern detection unit configured to perform pattern detection on at least two packets.

30. The compressor of claim 29, wherein the pattern detection unit is configured to acknowledte the at least two packets.

31. The compressor of claim 30, wherein the at least two packets comprise a first packet and a second packet, and wherein the compressor further comprises:
a receiver unit configured to receive a first acknowledgement having at least the first packet and configured to receive a second acknowledgement having at least the second packet.

32. The compressor of claim 25, wherein the stream comprises a first packet having a first sequence number and a first marker bit, said stream comprising a second packet having a second sequence number and a second marker bit, and wherein the compressor further comprises:
an acquisition unit configured to acquire the first packet and the second packet; and
a detection unit configured to detect that the second sequence number is one more than the first sequence number and that the first marker bit and the second marker bit are set.

33. The compressor of claim 32, wherein the stream is a real time transport protocol packet stream and the pattern comprises a time stamp function, a marker bit function, a quotient, and a time stamp increment, wherein the ensurer unit is configured to send the pattern.

34. The compressor of claim 25, wherein the media stream further comprises a first packet having a first sequence number and a first marker bit, said stream comprising a second packet having a second sequence number, a second time stamp and a second marker bit, a third packet said third packet having a third time stamp and a third marker bit, wherein the compressor further comprises:
a storage unit configured to store the first packet, second packet, and the third packet; and
a detection unit configured to detect that the second sequence number is one more than the first sequence number, to detect that the third time stamp is the same as the second time stamp, and to detect that the third marker bit is the same as the first marker bit.

35. The compressor of claim 34, wherein the stream is a real time transport protocol packet stream and the pattern comprises a time stamp function, a marker bit function, a quotient, and a time stamp increment, and wherein said ensurer unit is configured to send the pattern.

36. The compressor of claim 25, further comprising:
an acquisition unit configured to acquire the pattern at the decompressor.

37. The compressor of claim 26, wherein the sender unit is configured to explicitly send the pattern from the compressor to the decompressor.

38. The compressor of claim 25, wherein the stream is a real time transport protocol packet stream and the pattern comprises a time stamp function expressed as a staircase function of the packet serial number, the staircase function having at least one staircase step, and a marker bit function, wherein said ensurer unit is configured to send the pattern.

39. The compressor of claim 25, wherein the stream is a real time transport protocol packet stream and the pattern comprises a time stamp function expressed as a staircase function of the packet serial number, the staircase function having at least one staircase step, and a marker bit function wherein the marker bit is set for a last packet of the staircase step, wherein said ensurer unit is configured to send the pattern.

40. The compressor of claim 39, wherein the marker bit is configured to be set only for the last packet of the staircase step.

41. The compressor of claim 40, wherein the ensurer unit is configured to receive an indication having a marker bit set.

42. The compressor of claim 40, wherein the ensurer unit is configured to receive a first ack and a second ack.

43. The compressor of claim 40, wherein the ensurer unit further comprises a pattern detection unit configured to perform pattern detection on at least two packets.

44. The compressor of claim 43, wherein the pattern detection unit is configured to acknowledge the at least two packets.

45. The compressor of claim 43, wherein the at least two packets comprise a first packet and a second packet, and wherein the compressor further comprises:
   a receiver unit configured to receive a first acknowledgement having at least the first packet and configured to receive a second acknowledgement having at least the second packet.

46. The compressor of claim 40, wherein the real time transport protocol packet stream comprises a first packet having a first sequence number and a first marker bit, said stream comprising a second packet having a second sequence number and a second marker bit, and wherein the compressor further comprises:
   an acquisition unit configured to acquire the first packet and the second packet; and
   a detection unit configured to detect that the second sequence number is one more than the first sequence number and that the first marker bit and the second marker bit are set.

47. The compressor of claim 46, wherein the pattern comprises a time stamp function, a marker bit functions a quotient and a time stamp increment, and wherein the ensurer unit is configured to send the pattern.

48. The compressor of claim 40, wherein the sender unit is configured to explicitly send the pattern from the compressor to the decompressor.

49. A compressor, comprising:
   acquisition means for acquiring a pattern at a compressor by determining a function of one attribute in relation to another attribute according to a stream that is configured to arrive at the compressor;
   ensurer means for making sure a decompressor is synchronized with the compressor according to the pattern; and
   sender means for sending a compressed packet according to the pattern.

* * * * *